United States Patent [19]

Nakata

[11] Patent Number: 5,588,008
[45] Date of Patent: Dec. 24, 1996

[54] METHOD FOR GENERATING TEST PATTERNS FOR USE WITH A SCAN CIRCUIT

[75] Inventor: Tsuneo Nakata, Kawasaki, Japan

[73] Assignee: Fujitsu Limited, Kawasaki, Japan

[21] Appl. No.: 966,338

[22] Filed: Oct. 26, 1992

[30] Foreign Application Priority Data

Oct. 25, 1991 [JP] Japan ...................................... 3-279316

[51] Int. Cl.$^6$ ...................................................... H04B 1/52
[52] U.S. Cl. ............................ 371/27; 371/22.3; 371/22.6; 371/24
[58] Field of Search ........................... 371/27, 22.3, 22.6, 371/24, 25.1, 26, 29.1

[56] References Cited

U.S. PATENT DOCUMENTS

| | | | |
|---|---|---|---|
| 4,687,988 | 8/1987 | Eichelberger et al. | 324/73 AT |
| 4,716,564 | 12/1987 | Hung et al. | 371/27 |
| 4,728,883 | 3/1988 | Green | 324/73 R |
| 4,744,047 | 5/1988 | Okamoto et al. | 371/27 X |
| 4,745,355 | 5/1988 | Eichelberger et al. | 324/73 R |
| 4,754,215 | 6/1988 | Kawai | 371/27 X |
| 4,775,977 | 10/1988 | Dehara | 371/27 |
| 4,779,273 | 10/1988 | Beucler et al. | 371/25.1 |
| 4,801,870 | 1/1989 | Eichelberger et al. | 324/73 R |
| 4,862,460 | 8/1989 | Yamaguchi | 371/27 |
| 4,931,723 | 6/1990 | Jeffrey et al. | 371/22.3 |
| 5,010,552 | 4/1991 | Dias et al. | 371/27 |
| 5,127,010 | 6/1992 | Satoh | 371/27 |
| 5,130,647 | 7/1992 | Sakashita et al. | 324/158 R |
| 5,132,974 | 7/1992 | Rosales | 371/22.3 |
| 5,155,432 | 10/1992 | Mahoney | 324/158 R |
| 5,159,600 | 10/1992 | Chintapalli et al. | 371/27 |
| 5,175,494 | 12/1992 | Yoshimori | 324/158 R |
| 5,239,262 | 8/1993 | Grutzner et al. | 371/27 |
| 5,257,268 | 10/1993 | Agrawal et al. | 371/27 |
| 5,291,495 | 3/1994 | Udell, Jr. | 371/22.3 |
| 5,297,151 | 3/1994 | Grutzner et al. | 371/27 |
| 5,430,736 | 7/1995 | Takeoka et al. | 371/23 |

FOREIGN PATENT DOCUMENTS 0342787  11/1989  European Pat. Off. .

Primary Examiner—Emanuel T. Voeltz
Assistant Examiner—Patrick J. Assouad
Attorney, Agent, or Firm—Staas & Halsey

[57] ABSTRACT

A method for generating a test pattern for use with a scan circuit utilized in detecting a degenerative failure in a synchronous sequential circuit including a memory element unit, having a scan register, and a combination circuit unit for receiving an external input and inputting a value from the memory element unit, and for supplying an external output and outputting a value to the memory element unit. The method includes generating, for an undetected failure, a test pattern for use in a combinational circuit. The method also includes generating a test pattern series for detecting a different failure by observing its external output value and by changing the external input value with the value set in a scan register of the memory element unit.

8 Claims, 13 Drawing Sheets

NUMBER OF FAILURES 26

✕ : 0, 1 DEGENERATION (SA0,SA1)

NUMBER OF FAILURES 16

✕ : 0, 1 DEGENERATION (SA0,SA1)

EXAMPLE OF EQUIVALENT FAILURES

NUMBER OF FAILURES 10

✕ : 1 DEGENERATION (SA1)
✕ : 0 DEGENERATION (SA0)

CIRUIT EXAMPLE

RESULT OF GENERATING TEST PATTERN
FOR TARGET FAILURE

RESULT OF CREATING TEST PATTERN FOR TARGET FAILURE

APPLICATION OF RANDOM PATTERN

APPLICATION OF EXPANSION PATTERN

DEGENERATION OF ALL FAILURES TO 0

FAILURE UNDETECTABLE BY EXPANSION PATTERN

INSERTION OF FAILURE AND INCLUSIVE OPERATION

BACKWARD TRACKING

PROCESSING COMPLETION

METHOD FOR GENERATING TEST PATTERNS FOR USE WITH A SCAN CIRCUIT

BACKGROUND OF THE INVENTION

1. Field of the Invention

This invention pertains to a method for generating test patterns for use with a scan circuit so as to obtain an input series of test patterns for distinguishing a state without a failure from a state with a failure, including a degenerative failure.

Test pattern generation is a process of generating test patterns for use in an inspection process for distinguishing a defective part from a good part, which is indispensable for improving the reliability of an electronic circuit.

A circuit built on a printed circuit board can be used for detecting a failure such as a degenerative failure by directly observing a connection point in the circuit as well as inputting test patterns. However, it is impossible to directly observe a connecting point in a circuit structured as a semiconductor IC. Therefore, a large number of test patterns and a large amount of time has been required for inspecting a semiconductor integrated circuit.

An art is sought for reducing the test time during which test patterns are applied.

2. Description of the Related Arts

In general, a failure as an object for a test pattern generation is a degenerative failure of a signal line. This is a failure such that the logical value of a signal line in a circuit is fixed to either zero [0] or one [1].

FIGS. 1A and 1B are explanatory views of a sequential circuit, and FIG. 1C is an explanatory view of a scan circuit model.

FIG. 1A shows a generic synchronous sequential circuit, comprising a combinational circuit module 14 and a memory element unit 15, or memory element part, for storing the current state. A commonplace approach for use as a method for generating a test pattern for such a sequential circuit is to apply a combinational circuit method for generating a test pattern after repetitive expansions of the combinational circuit are preformed in a time direction.

The method is explained in the following literatures.

Kubo, H.: "A Procedure for Generating Test Sequences to Detect Sequential Circuit Failures", "NEC J. Res. Dev. (12), pp. 69–78, 1968".

Piteously, G. and Roth, J.: "A Heuristic Algorithm for the Testing of Asynchronous Circuits", IEEE Trans. Computers, Vol. C-20, No. 6, pp. 639–647, 1971.

A generic method for generating a test pattern such as this has problems that the processing can take an extremely large amount of time and that the failure detection rate by an obtained pattern is not always sufficient.

FIGS. 1B and 1C show an approach for making a method for generating test patterns for use in a combinational circuit be applicable especially to a large scale circuit through a conversion of a synchronous sequential circuit (shown in FIG. 1B) into a scan circuit (shown in FIG. 1C). As shown in FIG. 1C, a scan circuit is a circuit whose internal memory elements D, D, . . . are realized by shift registers such that all the memory elements can receive (write-in/scan-in) respective values from an external terminal and supply (read-out/scan-out) respective values to an external terminal. The internal memory elements are called scan registers.

The memory element unit 15 can switch between a parallel-in/parallel-out mode and a serial-in/serial-out mode by a mode switch input. When a plurality of registers receive a test pattern, the memory element unit 15 switches to the serial-in/serial-out mode, thereby serially receiving a test pattern in synchronization with a scan clock. Then, the memory element unit 15 switches to the parallel-in/parallel-out mode, and the combinational circuit unit 14 receives test pattern data via an output terminal SI. This enables the combinational circuit unit 14 to receive a test pattern. An external input terminal PI receives a test pattern on the external input side corresponding to the test pattern stored in the memory element unit 15.

The test pattern received by the combinational circuit unit 14 as a result of the above operations is outputted from the combinational circuit unit 14 after the test pattern is processed in the combinational circuit. A part of the result is outputted at an external output terminal PO and the rest is inputted to the memory element unit 15. Although the part of the result outputted from an external output terminal PO can be confirmed directly, the rest of the result inputted to the memory element unit 15 cannot be confirmed directly. To confirm the rest of the result, the memory element unit 15 switches at this time to a serial-in/serial-out mode, and by applying a scan clock, the result is read as serial data and confirms whether or not it is correct.

The memory element unit 15 minimizes the number of external pins by combining all memory elements in a form of a shift register.

Ordinarily, only four [4] pins, i.e. a scan-in terminal for supplying data, a scan-out terminal for reading data, one [1] type of clock terminal for driving a shift register, and one [1] type of mode switch terminal, are added.

A scan circuit in which all the memory elements are changed to scan registers is called a total scan circuit and a scan circuit in which a part of the memory elements are changed to scan registers is called a partial scan memory. The total scan circuit, for example, will be explained hereinafter.

Because a total scan circuit, in which all the memory elements are changed to scan registers, is capable of being read out and written in via an external terminal, when a test pattern is generated, an input to and an output from the memory element unit 15 shown in FIG. 1A are considered respectively as external outputs and external inputs. An application of a method for generating a test pattern to the combinational circuit unit 14 enables all non-redundant degenerative failures to be detected.

When a test pattern obtained in this manner is applied to an actual circuit comprising the sequential circuit which includes a combinational circuit and memory elements; of the obtained pattern, the part corresponding to the memory element unit 15 is written in (scanned-in) to a scan input terminal. After the external input value is set, a clock for operating the circuit is activated, and the value of the external output and the value read out (scanned-out) from the scan output terminal are observed.

FIG. 2 is a flowchart for explaining a conventional test procedure.

More specifically, FIG. 2 shows the procedure of a scan circuit for performing a test of a sequential circuit by using a test pattern generated by a conventional method for generating a test pattern as steps ST1 through ST6.

Step ST1

Determine whether any test pattern remains by attempting to extract a test pattern. When all test patterns have been examined, i.e. if no test pattern remains (NO), terminal the test (END). If a pattern remains (YES), invoke step ST2.

Step ST2

Set a test pattern in the memory element unit 15 by supplying the part corresponding to the memory element unit 15 from the scan input terminal. Continue to step ST3.

Step ST3

Set the rest of the test pattern as external input values. Continue to step ST4.

Step ST4 Activate the clock for driving the circuit.

Step ST5

Observe an external output value and a value read from the scan output terminal. Then, loop back to step ST1 and repeat similar processes for the next test pattern. A failure will be detected according to the observation values.

A total scan circuit has the following two [2] problems.

(1) An enlarged circuit size (2) A prolonged test period

Generally, when a circuit has its internal memory elements replaced with a shift register, the circuit size increases by about twenty percent [20%] and the circuit's operating speed deteriorates slightly. To avoid these problems, a partial scan circuit may be used in which only some but not all memory elements are replaced by scan registers. Although, in the partial scan circuit, the method for generating a test pattern for use in a combinational circuit cannot be used "as is" unlike the total scan circuit, by optimally using an appropriate method for replacing a part of the test pattern with a scan operation, the test may be made easier with a minimum increase in a circuit size. However, even this method cannot completely solve the above problems (1) and (2).

When a test is performed for a total scan circuit or a partial scan circuit, it is necessary to perform all scan-ins and scan-outs for all patterns. Since a circuit has its memory elements scattered around the entire circuit and the wiring length is large, the scan clock speed for a scan-in and a scan-out is relatively slow at several megahertz [MHz]. On the other hand, the part in the circuit operating for the intended purpose operates at a clock speed of several tens of megahertz [MHz]. Therefore, it can be said that the duration required for a scan-in/scan-out determines the test period.

Assume now that the characteristic values of a scan circuit are defined as follows.

One [1] cycle of a scan clock: $T_{scan}$ (500 ns)

One [1] cycle of a system clock: $T_{sys}$ (20 ns)

The number of scan registers: $N_{scan}$ (2000)

The number of patterns: $N_{pat}$ (10000)

The following formula represents a test period T for the above signs.

$$T = N_{pat}(T_{sys} + 2N_{scan}T_{scan})$$

Assuming the above values in parentheses, T must be approximately twenty second [20s], which is unacceptable for inspections of chips produced in large quantities. More than 99% of the test period T is required for scan-ins and scan-outs.

As described above, the prior art has a problem in that the test period is overly prolonged.

SUMMARY OF THE INVENTION

This invention pertains to a method for generating a test pattern of a synchronous sequential circuit for obtaining an input series for identifying a state inclusive of a failure from a state exclusive of a failure by assuming a state in which the sequential circuit includes a degenerative failure.

It aims at generating a test pattern capable of reducing a test period by reducing the numbers of scan-ins and scan-outs.

It configures the method for generating a test pattern for use with a scan circuit, comprising: a first step of generating, for an undetected failure, a test pattern for use in a combinational circuit by applying a method for generating a test pattern for use in a combinational circuit; and a second step of expanding a pattern for generating a test pattern series for detecting a different failure by observing its external output value by changing the external input value with the value set in scan registers in the scan circuit fixed, with regard to the generated test pattern for use in the combinational circuit.

BRIEF DESCRIPTION OF THE DRAWINGS

One of skill in the art can easily understand additional features and objects of this invention from the description of the preferred embodiments and some of the attached drawings. In the drawings.

DESCRIPTION OF THE PREFERRED EMBODIMENTS

Figure 1A:
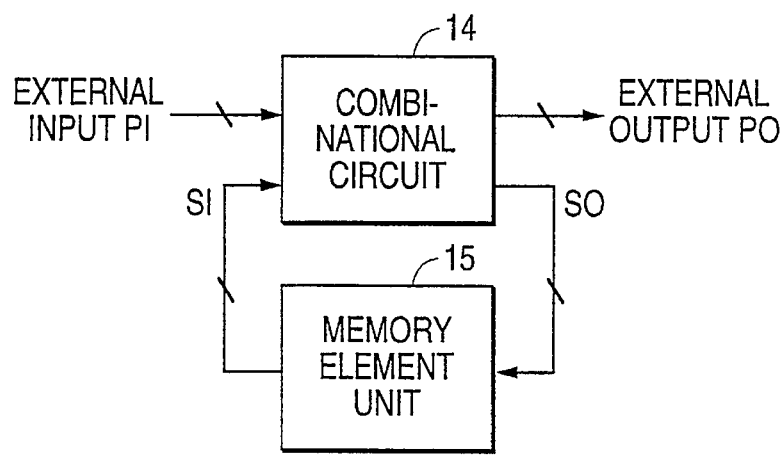
FIGS. 1A and 1B are explanatory views of a sequential circuit and FIG. 1C shows a view of a scan circuit.
Figure 1B:
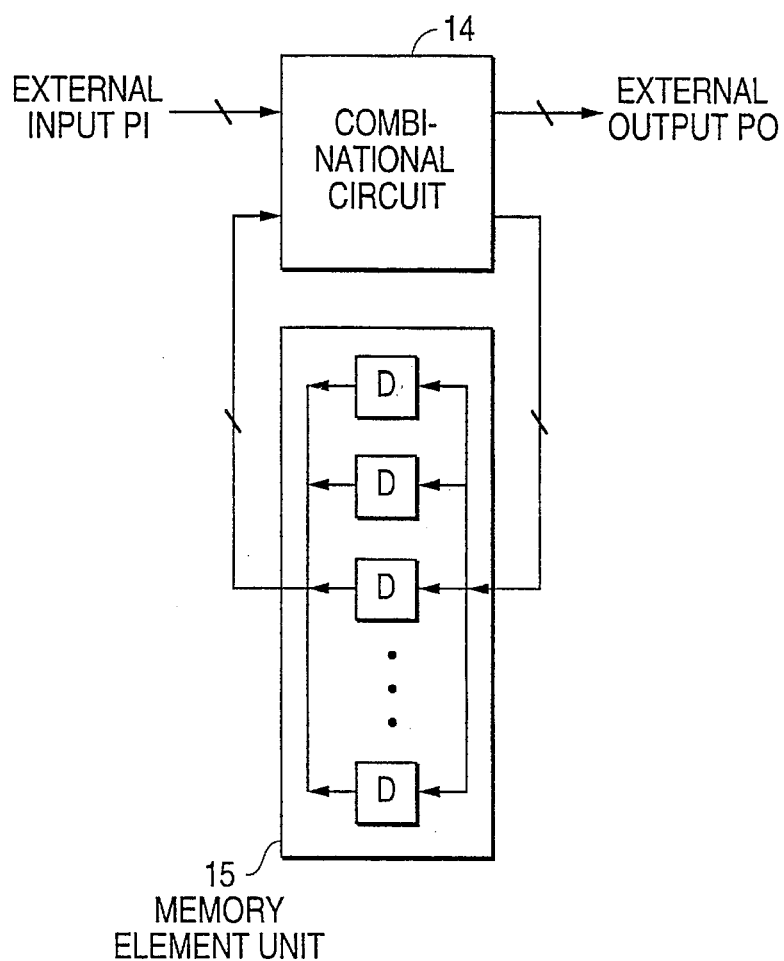
Figure 1C:
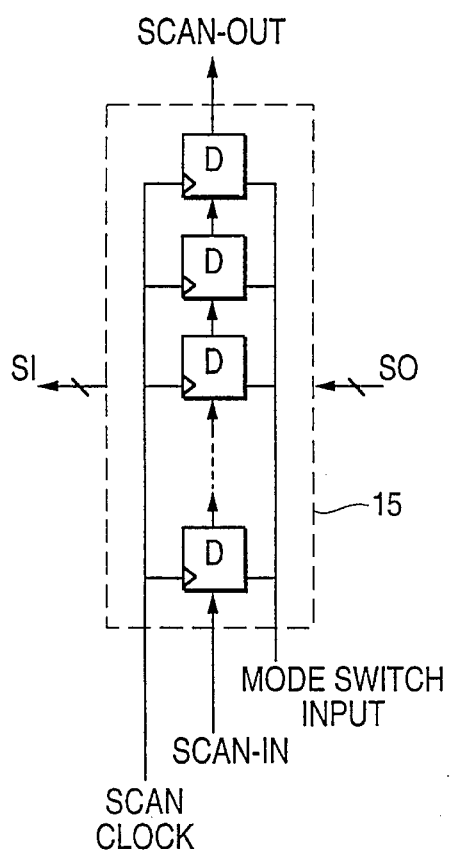
Figure 2:
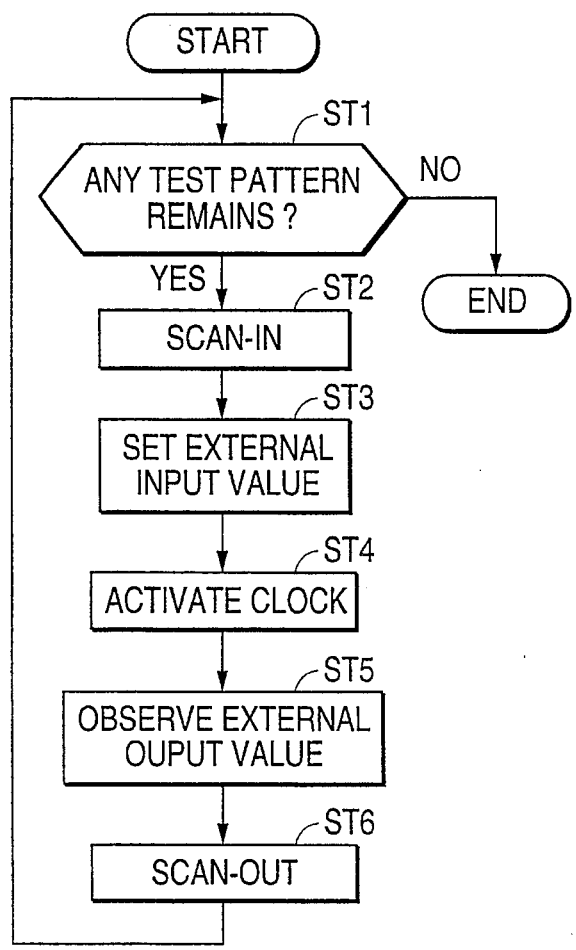
FIG. 2 is a flowchart for explaining a conventional test procedure.
Figure 3A:
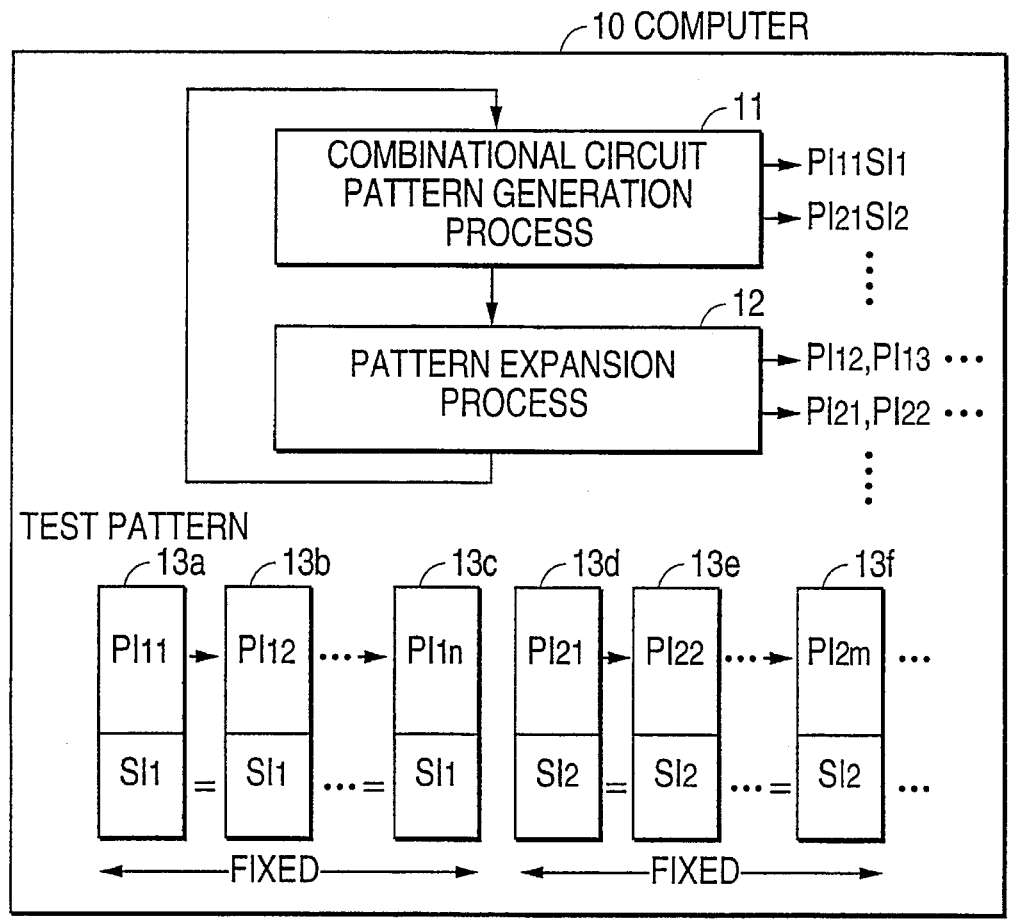
FIGS. 3A and 3B are block diagrams for explaining this invention.

FIG. 3A is a block diagram of this invention.

Figure 3B:
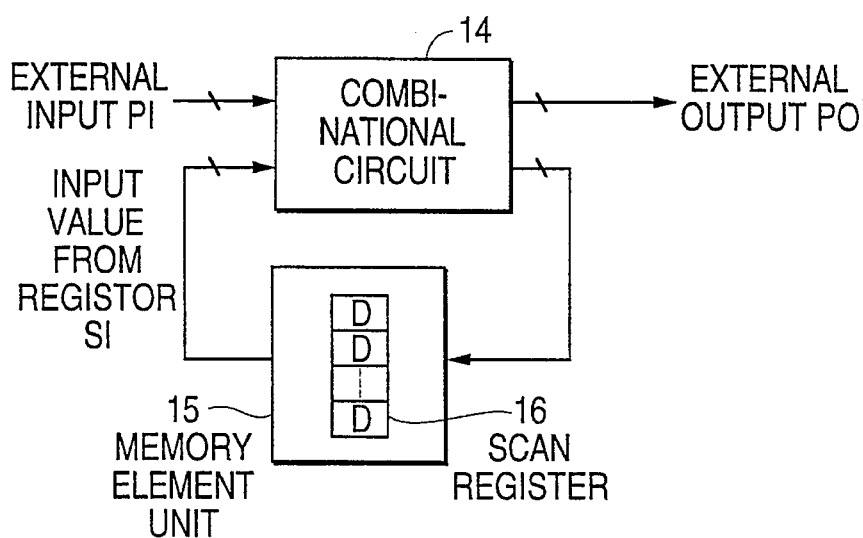

This invention pertains to a method for generating a test pattern for use in a synchronous sequential circuit (hereinafter referred to as a scan circuit) in which the memory element unit 15 is formed by a scan register 16 as shown in FIG. 3B. The present invention can be applied to a total scan circuit and a partial scan circuit operating within its scan range. A computer 10 performs the following processes.

A combinational circuit pattern generation process 11 is for generating test patterns (PI11, SI1, PI$_{21}$, SI$_2$, . . . ) for a combination circuit by using a connectional method of generating a test pattern for a certain failure which is not yet detected.

A pattern expansion process 12 contributes a generation of an input series of test patterns for detecting different failures through an observation of the value of an external output by changing the value of an external input with the values set in a scan register 16 in the memory element unit 15, of the values determined by the generated test patterns ($PI_{11}$, $SI_1$, $PI_{21}$, $SI_2$, . . . ) for use in a combinational circuit, being fixed.

By adding, as an expansion pattern, a test pattern of a failure detected in a state in which the value set in the scan register 16 is fixed, and by expanding a pattern generated in the combinational circuit pattern generation process 11, a test pattern for use in a scan circuit is generated.

Also, in the pattern expansion process 12, by supplying a random pattern as an external input with the value set in the scan register 16 being fixed, and by examining a failure further detectable through a failure simulation, a pattern is selected for an addition to an input series of test patterns, thereby expanding patterns.

In addition, in the pattern expansion process 12, an application of a method for generating a test pattern for use in a combinational circuit by selecting failures which are not yet detected allows a value to be set in an external input to be obtained as a test pattern for an addition to the input series of test patterns.

That is, this invention is such that after a test pattern (e.g. a test pattern $13a=PI_{11}+SI_1$) for detecting a degenerative failure is obtained by a conventional method for generating a test pattern for use in a combinational circuit, external input values ($PI_{12}$, $PI_{13}$, . . . , $PI_{1n}$), for detecting other failures under a single value (ST1) of the scan register 16, signal value being used during a generation of the original pattern, are obtained for additions to the original test pattern.

A pattern expansion process 12 generates sets of test patterns 13b, . . . , 13c and 13e, . . . , 13f respectively for test patterns 13a and 13d generated in the combinational circuit pattern generation process 11.

For obtaining a pattern for detecting other failures under a value of the scan register 16, a method for listing up detectable failures by simulating failures through the use of random patterns or a method for generating a test pattern for use in a combinational circuit by selecting an undetected failure in a combinational circuit have been proposed.

A conventional method for generating a test pattern for a scan circuit is premised on an execution of a series of tests, including a scan-in, a setting of an external input value, a clock activation, an observation of an external output value and a scan-out, after obtaining a test pattern for detecting a failure.

On the other hand, this invention is such that tests are executed for a series of procedures comprising a setting of a normal external input value, a clock activation and an output value observation after a scan-in, by repeating the value setting of the external input value and the observation of the external output value.

More specifically, according to the method for generating test patterns of this invention, a test pattern for detecting a failure is obtained, and the patterns are expanded without causing circuit operations for the original test pattern to be changed when the failures which can be detected by those patterns are listed up. This enables the number of scan-ins and scan-outs to be reduced with an improved rate of failure detection, thereby allowing a test period to be shortened.

A test period is calculated with this invention applied by assuming the following values.

One [1] cycle of a scan clock: $T_{scan}$ (500 ns)
One [1] cycle of a system clock: $T_{sys}$ (20 ns)
The number of scan registers: $N_{scan}$ (2000)
The number of patterns: $N_{pat}$ (10000)
Here, the following value is newly defined.
The extension pattern number per pattern: $N_{ext}$ (10)

Because this limits the number of scan-ins and scan-outs to about $1/N_{ext}$, the test period is given by the next expression:

| Text | = Npat/Next | (NextTsys + 2NscanTscan) |
|---|---|---|
| | = NpatTsys | + 2NpatNscanTscan/Next |

When the above values in parentheses are assumed, $T_{ext}$ is about two seconds [2s]. Because the prior art takes about twenty seconds [20s] for a test period as described earlier, it is known that the test period is reduced greatly. Because the larger the number of inputs, the greater the value of $N_{ext}$, the rate of reduction of the test period with increasing inputs is larger still.

Figure 4:
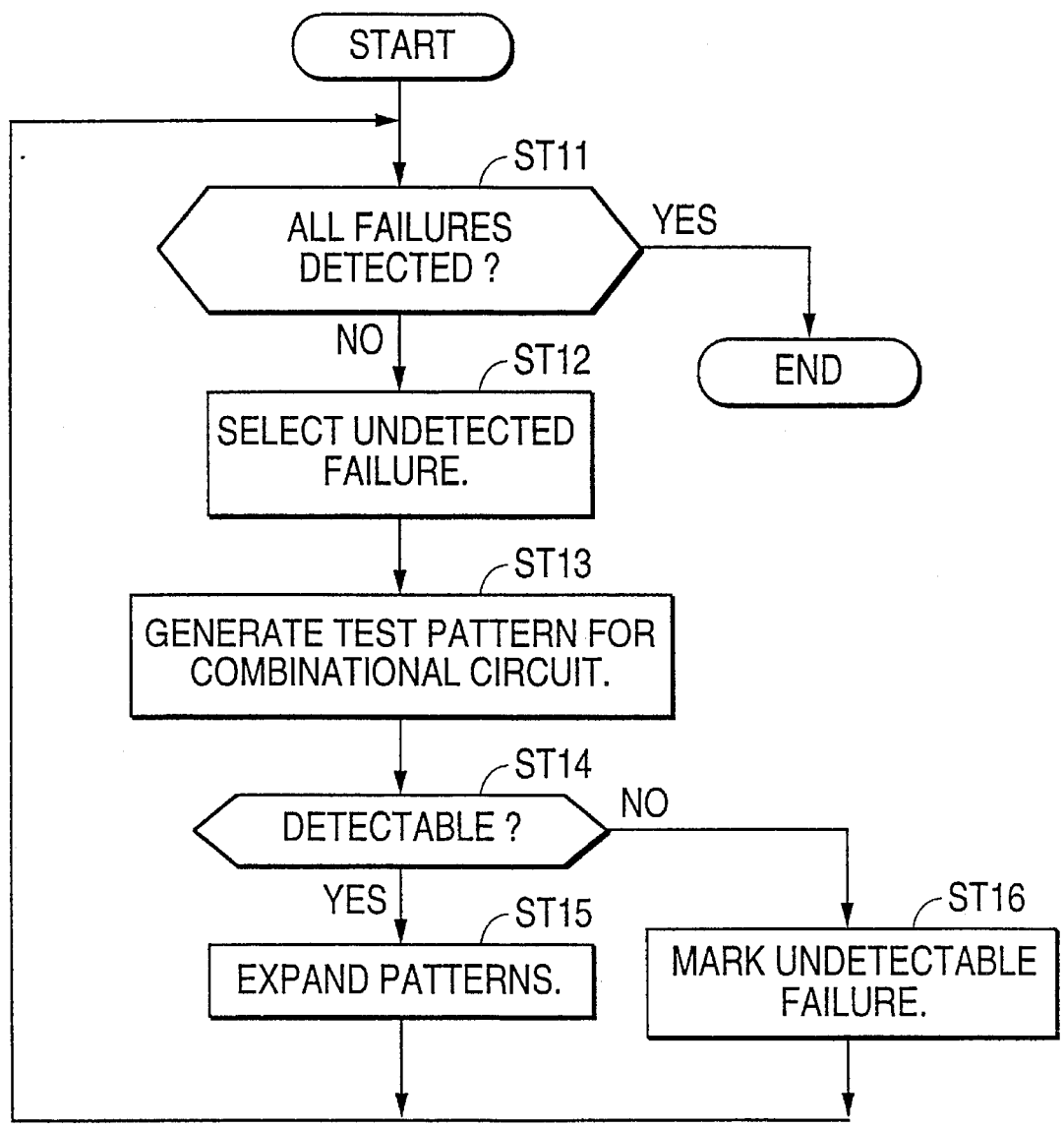
FIG. 4 is a flowchart of an embodiment of a test pattern generation process.

FIG. 4 is a flowchart of an embodiment of a test pattern generation process.

A start of a test pattern generation process invokes step ST11.

ST11

A state including a degenerative failure is assumed for a scan circuit of a test object, and it is determined whether test patterns have been generated for enabling all failures to be detected. This is equivalent to determining whether the set of undetected (undetected and unprocessed) failures is the null set. If the test patterns capable of detecting all failures have been generated (YES), the test pattern generation process ends. If all failures have not been detected (NO), if there are undetected failures, the test pattern generation process proceeds to step ST12.

ST12

An undetected failure is selected e.g. in a sequence of members of a set of failures. The test pattern generation process proceeds to step ST13.

ST13

Test patterns are generated such that undetected failures can be detected according to any of the conventional methods for generating a test pattern for use in a combination circuit. The test pattern generation process proceeds to step ST14.

ST14

It is determined whether or not a test pattern capable of detecting an undetected failure has been generated successfully. In case of an affirmative determination result (YES), proceed to step ST15. In case of a negative determination result (NO), skip to step ST16.

ST15

Figure 5:
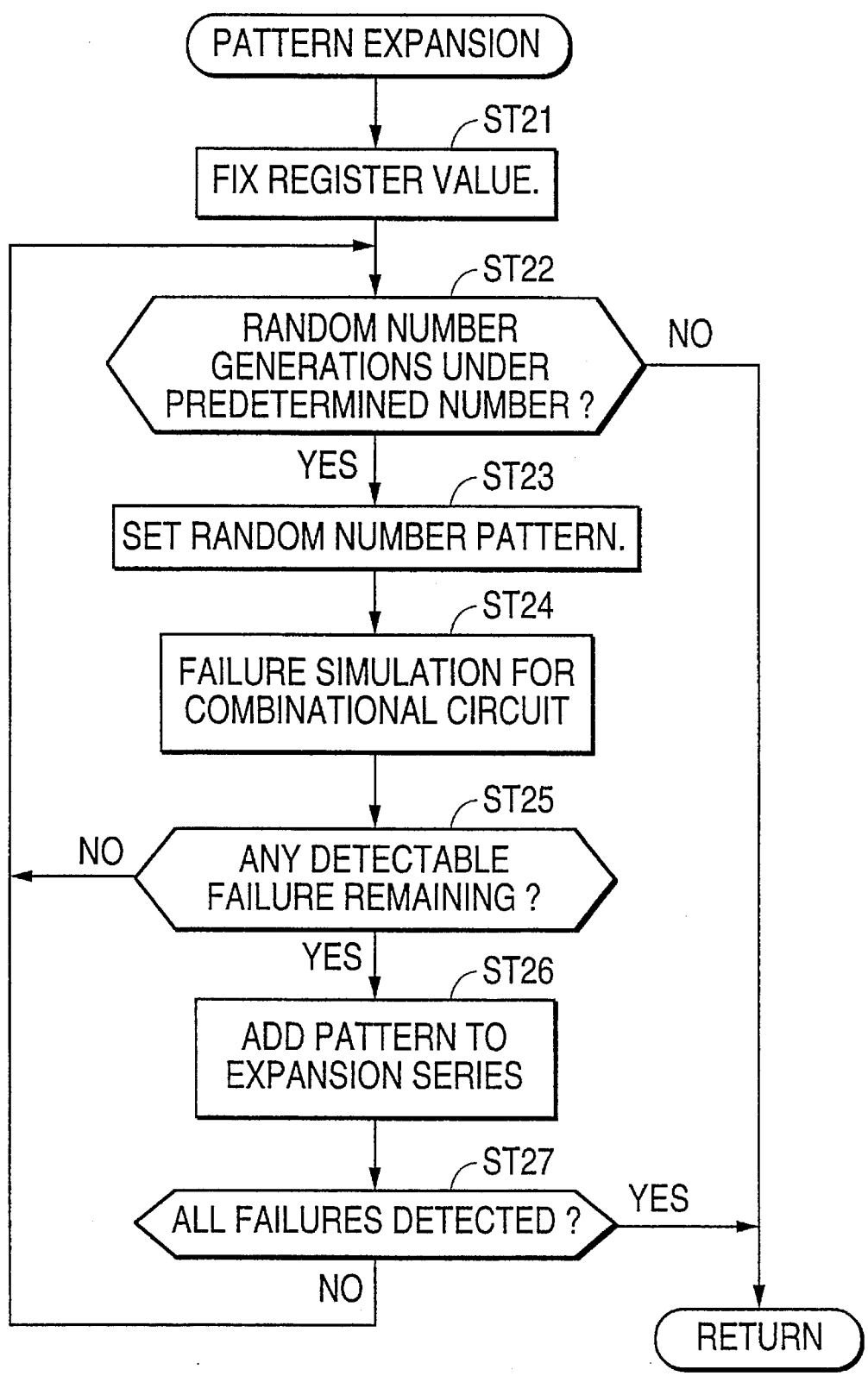
FIG. 5 is a flowchart of a first embodiment of the pattern expansion process shown as a step ST15 in FIG. 4.
Figure 6:
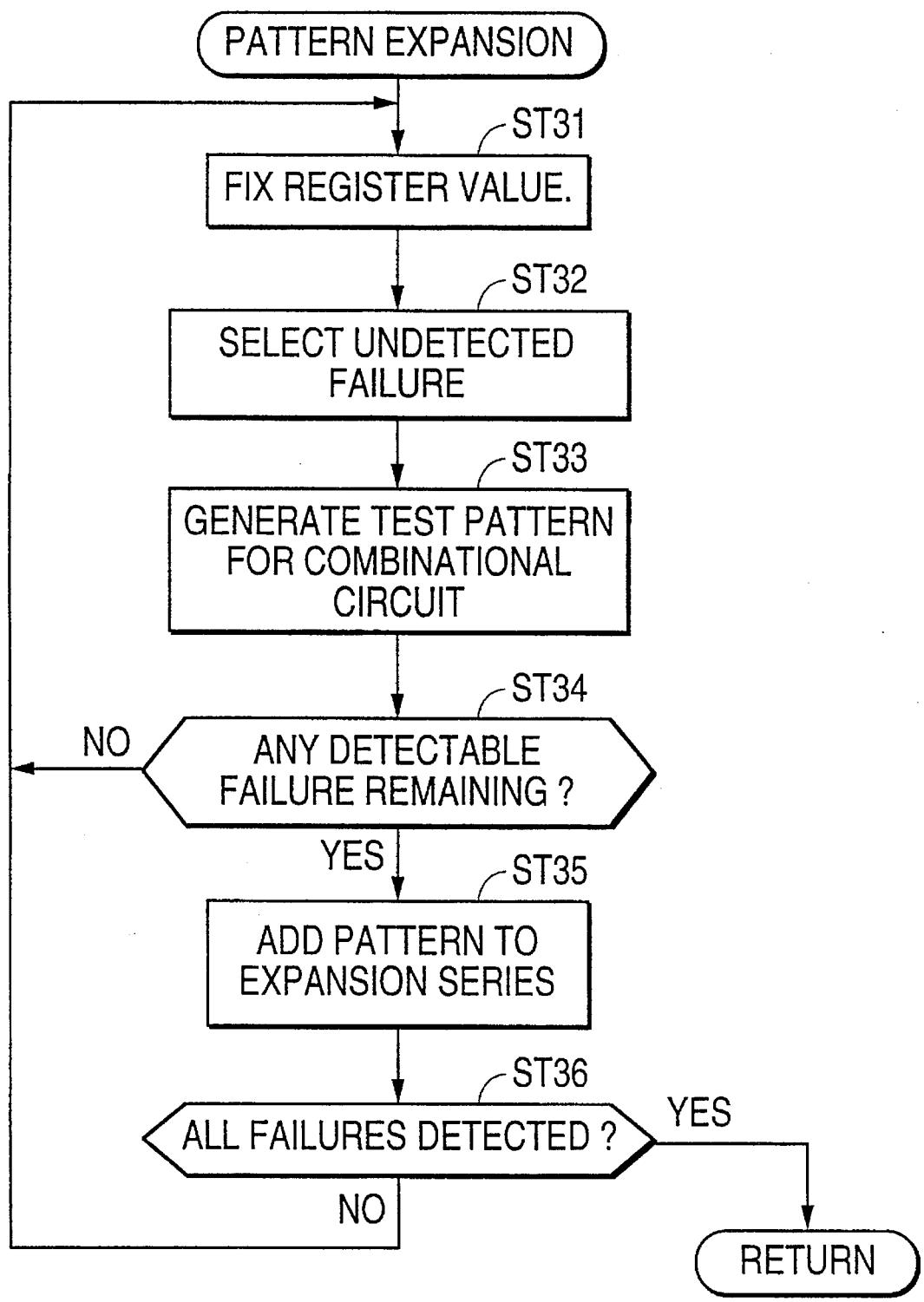
FIG. 6 is a flowchart of a second embodiment of the pattern expansion process shown as step ST15 in FIG. 4.

Pattern expansion processes shown in FIGS. 5 and 6 are executed for a generated test pattern, an effective test pattern is generated by changing the external input value with the value set in the scan register fixed. Revert to step ST1 in a loop form.

ST16

If a generation of a test pattern for detecting a selected undetected failure fails, the selected undetected failure is marked as an undetectable failure. Revert to step ST1 in a loop form.

FIG. 5 is a flowchart of a first embodiment of the pattern expansion process shown as step ST15 in FIG. 4.

A start of the pattern expansion process shown as step ST15 in FIG. 4 invokes step ST21.

ST21

Of the test patterns generated in step ST13 of the combinational circuit test pattern generation process shown in FIG. 4, the values in the part corresponding to the scan register are fixed. Proceed to step ST22.

ST22

It is determined whether or not the number of generated random numbers up to this instant in time has not reached a predetermined number. In case of an affirmative determination result (YES), proceed to step ST23. In case of a negative determination result (NO), the combinational circuit pattern expansion process ends, thereby returning to the test pattern generation process shown in FIG. 4 (RETURN). ST23

A random number is generated and a random pattern is set in a corresponding part in an external input. Proceed to step ST24.

ST24

A combinational circuit failure simulation is performed by using the value of the scan register fixed in step ST21 and the random pattern set in step ST23, thereby obtaining a detectable failure in the test pattern. (Because conventional methods used for a generic combinational circuit can be used for the combinational circuit failure simulation process, its explanation is omitted here.) Proceed to step ST25.

ST25

It is determined whether or not the result of a failure simulation indicates the presence of a detectable failure. In case of a negative determination result (NO), loop back to step ST22. In case of an affirmative determination result (YES), proceed to step ST26.

ST26

The pattern is added to an expansion series of test patterns. Proceed to step ST27.

ST27

It is determined whether or not all failures have been detected. In case of a negative determination result (NO), loop back to step ST22. In case of an affirmative determination result (YES), the pattern expansion process ends, thereby returning to the test pattern generation process shown in FIG. 4 (RETURN).

FIG. 6 is a flowchart of a second embodiment of the pattern expansion process shown as step ST15 in FIG. 4.

a start of the pattern expansion process shown as step ST15 in FIG. 4 invokes step ST31.

ST31

Of the test patterns generated in step ST13 of the combinational circuit test pattern generation process shown in FIG. 4, the value of the part corresponding to the scan register is fixed. Proceed to step ST32.

ST32

An undetected failure is selected from among assumed degenerative failures. Proceed to step ST33.

ST33

A value to be set as an external input is obtained e.g. by an application of a conventional method for generating a test pattern for use in a combinational circuit. Proceed to step ST34.

ST34

It is determined whether or not an undetected failure can be detected from the register value fixed in step ST31 and the external input value set in step ST33. In case of a negative determination result (NO), loop back to step ST31. In case of an affirmative determination result (YES), proceed to step ST35.

ST35

The pattern is added to the expansion series of test patterns. Proceed to step ST36.

ST36

It is determined whether or not all failures have been detected. In case of a negative determination result (NO), loop back to step ST31. In case of an affirmative determination result (YES), the pattern expansion process ends, thereby returning to the test pattern generation process shown in FIG. 4 (RETURN).

The above procedures allow a test pattern for scan-in and a pattern to be inputted to the input terminal for use with the scanned-in test pattern to be obtained. Described below is the test procedure using these test patterns.

Figure 7:
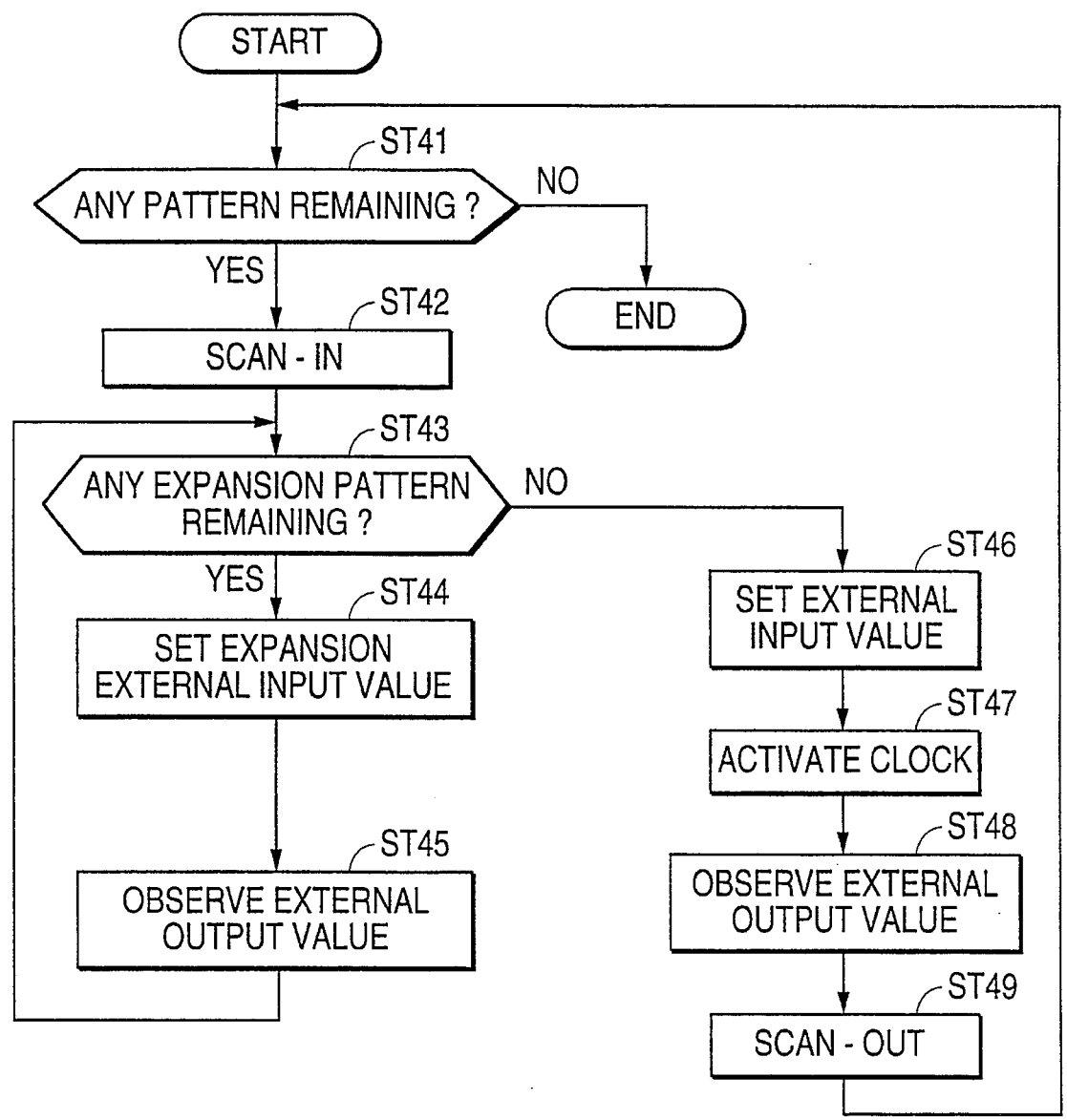
FIG. 7 is a flowchart for a test procedure using these test patterns.

FIG. 7 is a flowchart for a test procedure using these test patterns.

A start of the test procedure invokes step ST41.

ST41

The presence of an unapplied test pattern is determined. In case of a negative determination result (NO), i.e. if all test patterns have been applied, the test terminates (END). In case of an affirmative determination result (YES), proceed to step ST42.

ST42

The pattern to be set in the shift register/scan register (pattern is multi-bit) is canned in. Proceed to step ST43.

ST43

The presence of an expansion pattern is determined. In case of an affirmative determination result (YES), proceed to step ST44. In case of a negative determination result (NO), proceed to step ST46.

ST44

The external input value of the expansion pattern is set. Proceed to step ST45.

ST45

The external output value corresponding to the external input value set in step ST44 is observed. Revert to step ST43 in a loop form.

ST46

When there is no expansion pattern or when an application of an expansion pattern has ended, i.e. when an expansion pattern does not remain in step ST43 (NO), the value of the part in the test pattern corresponding to the external input of the normal test pattern is set as the external input value. Proceed to step ST47.

ST47

A system clock for operating the entire circuit is activated. Proceed to step ST48.

ST48

The external output value is observed. Proceed to step ST49.

ST49

The value read out (scanned out) from the scan output terminal is observed. Revert to step ST41 in a loop form, thereby performing the same steps for the next test pattern.

As described above, this invention enables a test to be performed for an expansion pattern through a use of a test pattern without executing a scan-in or a scan-out, thereby enabling the test period to be reduced.

FIGS. 8A through 8D show various cases of degenerative failures.

Figure 8A:
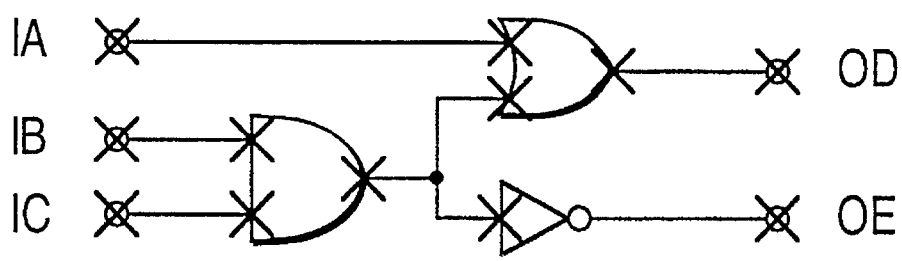
FIGS. 8A through 8D show various cases of degenerative failures.

FIG. 8A shows a case in which respective failures are assumed for external input/output pins and gate input/output pins, when the test pattern generation process is executed for a gate level circuit in a degenerative failure model.

More specifically, FIG. 8A shows a case in which a total of twenty-six [26] degenerative failures are assumed for external input/output pins and gate input/output pins, comprising six [6] degenerative failures of three [3] input terminals IA, IB and IC to zero [0] and one [1], four [4] degenerative failures of two [2] output terminals OD and OE to zero [0] and one [1], and sixteen [16] degenerative failures of the eight [8] input/output terminals of an OR gate, an AND gate and an inverter to zero [0] and one [1].

Figure 8B:
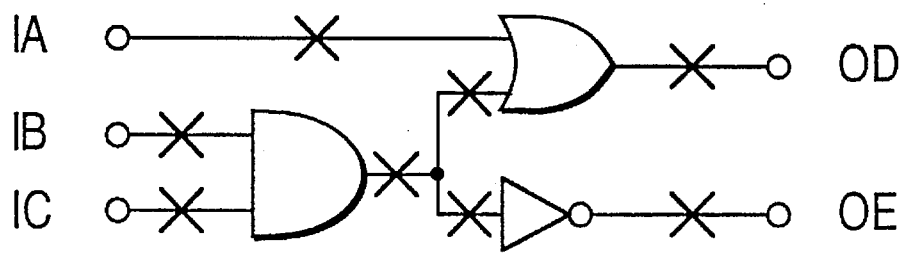

FIG. 8B shows an example of degenerative failures on signal lines connecting the pins, which are equivalent to those shown in FIG. 8A.

Because an application of the assumptions of degenerative failures at input/output pins (shown in FIG. 8A) "as is" requires equivalent degenerative failures on signal lines connecting these pins (shown in FIG. 8B) to be differentiated, the assumptions of degenerative failures along signal lines connecting those pins (shown in FIG. 8A) are used actually.

When a signal line branches, however, failures must be assumed respectively for a branch origination and branch destinations.

Figure 8C:
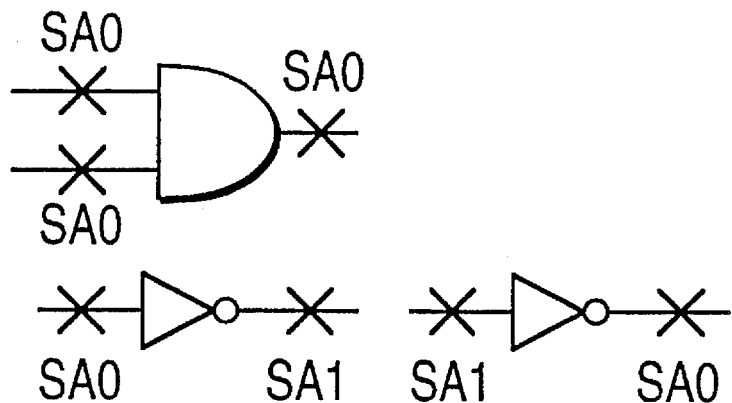

FIG. 8C shows cases in which equivalent degenerative failures in gate functions are eliminated. For instance, a degenerative failure of an inverter input to zero [0] (or one [1]) is equivalent to a degenerative failure of an inverter output to one [1] (or zero [0]). Also, degenerative failures of AND gate inputs to zero [0] are equivalent to a degenerative failure of an AND gate output to zero [0]. In those cases, equivalent degenerative failures are represented by a single degenerative failure.

Figure 8D:
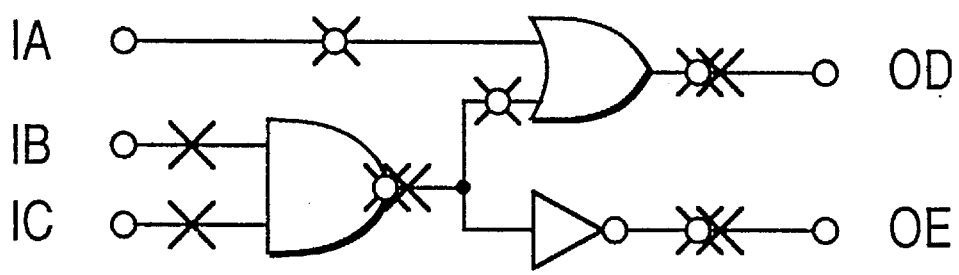

FIG. 8D shows failures assumed finally.

In a test pattern generation process, the degenerative failures assumed as above are treated as a set, whose data structure is that of a list or a table. That is, degenerative failures of respective signal lines to both zero [0] and one [1] are assumed initially, thereby generating a set of undetected failures, in which the number of elements is twice as much as the number of signal lines. This set is reduced through eliminations of equivalent degenerative failures shown in FIGS. 8A through 8D.

FIGS. 9A through 9G are explanatory charts for detecting a failure by a test pattern expansion.

Figure 9A:
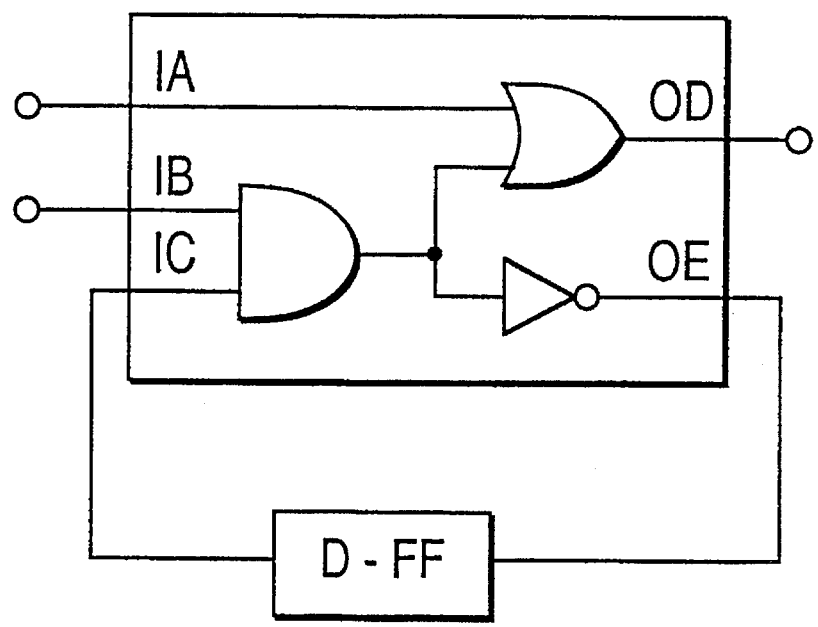
FIGS. 9A through 9G show explanatory views of failure detection by using a test pattern expansion according to the present invention.

FIG. 9A shows a scan circuit with this invention applied.

Figure 9B:
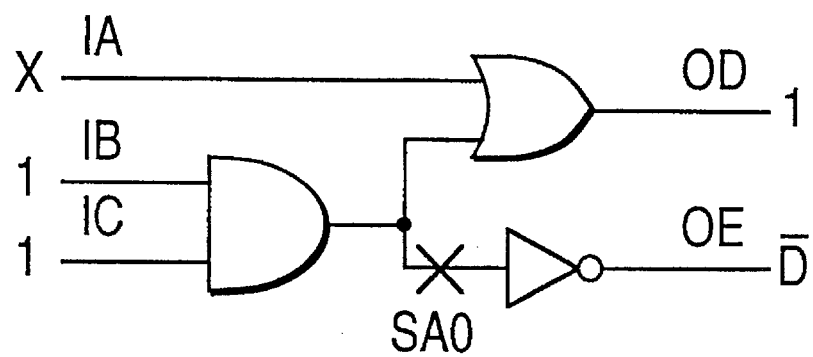
Figure 9C:
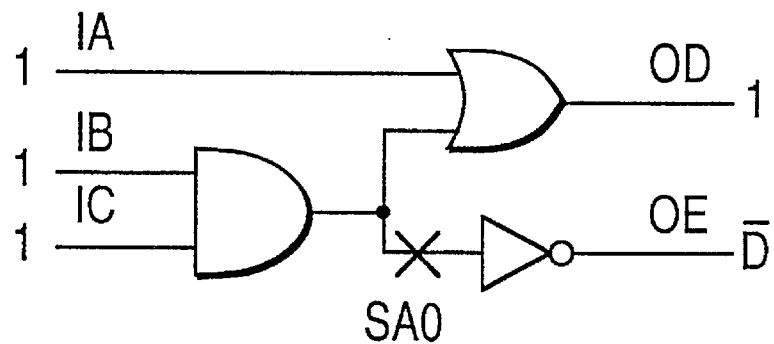

FIGS. 9B and 9C respectively show the result of generating a test pattern for a target failure and a test pattern for a target failure in which a conventional method for generating a test pattern for use in a combinational circuit is applied, by selecting a degenerative failure of an inverter input to zero [0] as an undetected failure in a scan circuit. In FIGS. 9B and 9C, D expresses a degenerative failure to zero [0] from a correct output value of one [1], while D expresses a degenerative failure to one [1] from a correct output value of zero [0]. It is assumed here that the scan register has a value of one [1].

then, an operation is performed for obtaining all detectable failures based on by an obtained pattern (x, 1). In this case, a conventional method for generating a test pattern is to apply a failure simulation by appropriately assigning zero [0] or one [1] to the value of x. For instance, as shown in FIG. 9C, the pattern can be (1, 1). That is, by scanning one [1] in to a scan register (D-FF) and by scanning its value out from the scan register (D-FF), it becomes possible to test all target failures.

A test pattern generation process obtains an input pattern for detecting a selected undetected failure. When its input is obtained, the selected undetected failure is eliminated from the set of undetected failures. When its input is not obtained, the selected undetected failure remains in the set of undetected failures as a failure already processed despite not having been detected. A failure simulation is a process for examining whether or not an output value changes, in the presence of a failure for each input pattern. All failures belonging to the set of undetected failures are assumed at this time, which means that a failure can be detected from the input pattern when an output value changes for an elimination from the set of undetected failures.

Figure 9D:
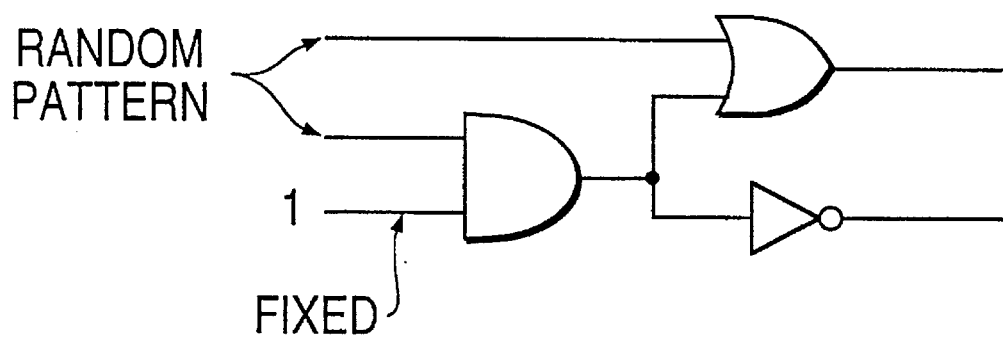
Figure 9E:
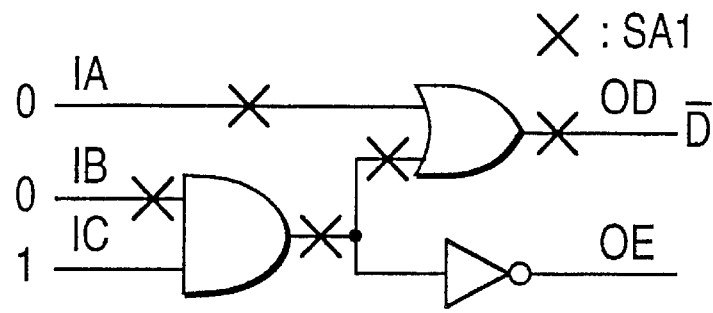
Figure 9F:
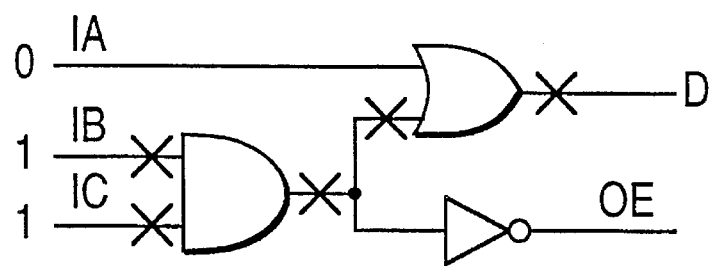
Figure 9G:
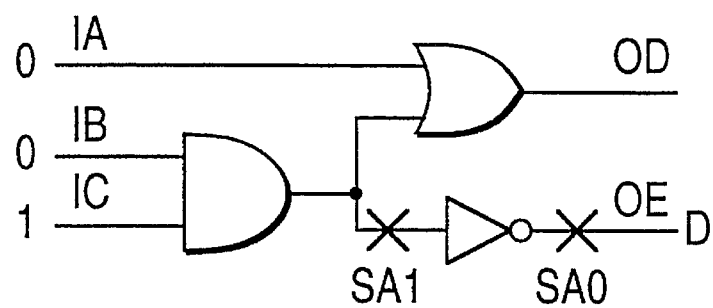

Further, this embodiment causes a test pattern to be expanded according to the following procedure. The external input value is changed under the condition in which the input value from the scan register is fixed to one [1]. As shown in FIG. 9D, this change is according to a random pattern. For instance, by making the external input (0, 0), five [5] degenerative failures to one [1], namely, stack at one [1] (SA1) shown in FIG. 9E can be detected. Also, by making the external input to (0, 1), five [5] degenerative failures to zero [0], namely, stack at zero [0] (SA0) shown in FIG. 9F can be detected. Although the failure shown in FIG. 9G causes the value of the signal line connected to the scan register (D-FF) to be changed, because no scan-out is performed for an expansion pattern, its failure cannot be detected. What cannot be detected unless a scan-out is performed, such as a failure in an output pin of an inverter, must be tested by normal patterns in steps ST46 through ST49, as described earlier.

To summarize the above, the test procedure by an expanded test pattern is as follows.

(1) Scan in and set one [1] to the scan register (D-FF).

(2) Set an expansion pattern (0, 0) and observe an external output. If there is another expansion pattern, the setting and observations are repeated here.

(3) Set a normal pattern (1, 1).

(4) Activate a system clock and observe an external output.

(5) Scan out and observe the value of the scan register (D-FF).

Either the method of setting a random pattern according to step ST23 shown in FIG. 5 or the method for generating a test pattern for use in a combinational circuit according to step ST33 shown in FIG. 6 may be used as the method for obtaining an expansion pattern in the above procedure. Although the former takes little effort in generating a test pattern, it does not ensure all detectable failures are detected. On the other hand, although the latter increases the processing volume, because it enables all detectable failures to be detected under a condition of a fixed logical value from the memory element, it enables the failure detection rate of detectable failures to be raised.

Figure 10A:
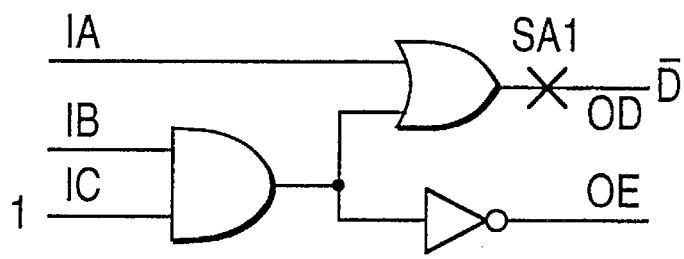
FIGS. 10A, 10B and 10C show examples of applying a method for generating an expansion test pattern for use in a combinational circuit to an undetected failure, which is explained in step ST33 shown in FIG. 6.
Figure 10B:
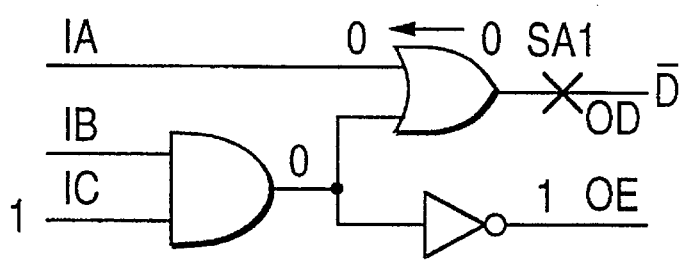
Figure 10C:
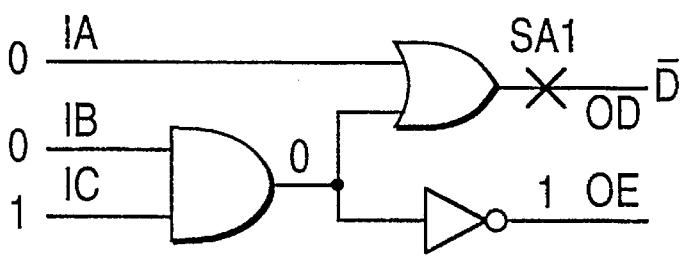

FIGS. 10A, 10B and 10C show an example of applying the method for generating the test patterns for use in a combinational circuit to an undetected failure, which is explained in step ST33 shown in FIG. 6.

An attempt is made to obtain an expansion pattern for detecting a degenerative failure to one [1] of the output from the OR gate shown in FIG. 10A. When the input is (1, 1), because a degenerative failure SA1 in the output of the OR gate to one [1] cannot be detected, a test pattern for detecting the degenerative failure is obtained under the condition that the input from the scan register is one [1].

Although one [1] is already set to the external input in the state shown in FIG. 10A, no other value can be set in an inclusive operation. Therefore, an inclusive operation does not allow any other value to be obtained.

This is because a degenerative failure to one [1] D of a terminal OD, which is supposed to be zero [0], must be detected.

Consequently, as shown in FIG. 10B, both two [2] inputs to the OR gate are determined to be zero [0]. Accordingly, it is known that the value of an external input terminal IA connected directly to an input of the OR gate must be made zero [0], and that the value of an external input terminal IB connected directly to the other input of the AND gate must be made zero [0]. Since the output of the OR gate is connected directly to an external output, the above procedure enables a test pattern (0, 0) to be obtained.

Although, in the above embodiment of this invention described earlier, a test pattern for obtaining a different failure is obtained by changing other data by preserving the test pattern for use in the combinational circuit and scan data obtained by the test pattern "as is" and later performing the test, this invention is not limited to such a configuration as this. Instead, a test may be conducted by generating a test pattern on a realtime basis.

As described above, this invention assumes a series of test procedures, such that the values of memory elements scanned-in are provided for input data obtained for detecting a failure by activating a system clock concurrently with an input of a normal test pattern, after repeating by an appropriate number of times the changes in the values of an external input and an external output. Accordingly, by adding a test pattern for a detectable failure in a state in which the value of the memory element unit 15 is fixed, input data are expanded. Because this enables both a detectable failure corresponding to the original input and a detectable failure corresponding to the input data close to the original data to be obtained, not only is the failure detection rate improved, but also the test period is shortened due to a reduction in the numbers of scan-ins and scan-outs.

That is, this invention makes it possible to increase the detectable failures without any change in the circuit response through pattern expansion of a pattern for detecting a failure. Because of an increase in the number of detectable failures per scan-in, it becomes possible to reduce the number of scan-ins and scan-outs, thereby enabling a significant reduction in the long test period, which is one of the problems in a scan circuit.

What is claimed is:

1. A method for generating test patterns for use with a scan circuit to detect a degenerative failure in a synchronous sequential circuit having a memory element comprising a predetermined scan register and a combinational circuit for inputting a value from an external input of the synchronous sequential circuit and said memory element, and for outputting a value to an external output of the synchronous sequential circuit and said memory element, said method for generating test patterns comprising:

a step of generating, for an undetected first failure, a first test pattern for use in a combinational circuit; and a step of pattern expansion for generating a second test pattern for detecting a second failure by changing the external input value of the synchronous sequential circuit, with value set in the predetermined scan register of said memory element fixed, with regard to the first test pattern generated in said generating step; and a step of adding a mark for use when the undetected failure cannot be checked in the second test pattern.

2. The method for generating test patterns for use with a scan circuit to detect a degenerative failure in a synchronous sequential circuit having a memory element comprising a predetermined scan register and a combinational circuit for inputting a value from an external input of the synchronous sequential circuit and said memory element, and for outputting a value to an external output of the synchronous sequential circuit and said memory element, said method for generating test patterns comprising:

a step of generating, for an undetected first failure, a first test pattern for use in a combinational circuit; and a step of pattern expansion for generating a second test pattern for detecting a second failure by changing the external input value of the synchronous sequential circuit, with value set in the predetermined scan register of said memory element fixed, with regard to the first test pattern generated in said generating step, wherein said step of pattern expansion comprises:

supplying a random pattern to an external input of the synchronous sequential circuit with the state in which said value set in said scan register being fixed;

examining a further detectable failure by a failure simulation; and extracting a pattern to be added to a series of test patterns.

3. The method for generating test patterns for use with a scan circuit to detect a degenerative failure in a synchronous sequential circuit having a memory element comprising a predetermined scan register and a combinational circuit for inputting a value from an external input of the synchronous sequential circuit and said memory element, and for outputting a value to an external output of the synchronous sequential circuit and said memory element, said method for generating test patterns comprising:

a step for generating, for an undetected first failure, a first test pattern for use in a combinational circuit; and a step of pattern expansion for generating a second test pattern for detecting a second failure by changing the external input value of the synchronous sequential circuit, with value set in the predetermined scan register of said memory element fixed, with regard to the first test pattern generated in said generating step, wherein said step of pattern expansion comprises the steps of:

selecting an undetected failure, obtaining a value to be set in an external input of the synchronous sequential circuit by generating a test pattern for use in said combinational circuit to detect said undetected failure, and adding a pattern of an obtained value to a series of test patterns.

4. The method of regenerating a test pattern for use with a scan circuit to detect a degenerative failure in a synchronous sequential circuit having a memory element comprising a predetermined scan register and a combinational circuit for inputting a value from an external input of the synchronous sequential circuit and said memory element, and for outputting a value to an external output of the synchronous sequential circuit and said memory element, said method for generating test patterns comprising:

a step of generating, for an undetected first failure, a first test pattern for use in a combinational circuit; and a step of pattern expansion for generating a second test pattern for detecting a second failure by changing the external input value of the synchronous sequential circuit, with value set in the predetermined scan register of said memory element fixed, with regard to the first test pattern generated in said generating step, wherein said scan circuit comprises all scan registers in said memory element.

5. A method for checking a synchronous sequential circuit, for use in detecting a degenerative failure in a synchronous sequential circuit having a memory element comprising a predetermined scan register and a combinational circuit receiving an external input and inputting a value from said memory element and for supplying an external output and outputting a value to said memory element, said method for checking the synchronous sequential circuit comprising:

a step of generating a first test pattern for use in a combinational circuit for an undetected first failure;

a step of generating a second test pattern for detecting a second failure by changing the value of an external input, with value set in the predetermined scan register in said memory element fixed, with regard to said first test pattern;

a step of checking the operations of said synchronous sequential circuit by scanning in at least a part of said first test pattern to be set in said scan register and by supplying said second test pattern to said synchronous sequential circuit; and a step of adding a mark for use when the undetected failure cannot be checked in the second test pattern.

6. A method for checking a synchronous sequential circuit, for use in detecting a degenerative failure in a synchronous sequential circuit having a memory element comprising a predetermined scan register and a combinational circuit means for receiving an external input and inputting a value from said memory element and for supplying an external output and outputting a value to said memory element, said method for checking the synchronous sequential circuit comprising:

a step of generating a plurality of first test patterns for use in a combinational circuit for an undetected first failure;

a step of generating at least one second test pattern for detecting a second failure by changing the value of an external input, with value set in the predetermined scan register in said memory element fixed, with regard to one of said plurality of first test patterns;

a step of checking the operations of said synchronous sequential circuit by scanning in at least a part of said first test patterns to be set in said scan register and by supplying said second test patterns to said synchronous sequential circuit;

a step of repeating said scan-in and associated checks in a number of times equivalent to a number of said first test patterns; and a step of adding a mark for use when the undetected failure cannot be checked in the second test pattern.

7. The method for checking a synchronous sequential circuit, for use in detecting a degenerative failure in a synchronous sequential circuit having a memory element comprising a predetermined scan register and a combinational circuit means for receiving an external input and inputting a value from said memory element and for supplying an external output and outputting a value to said memory element, said method for checking the synchronous sequential circuit comprising:

a step of generating a plurality of first test patterns for use in a combinational circuit for an undetected first failure;

a step of generating at least one second test pattern for detecting a second failure by changing the value of an external input, with value set in the predetermined scan register in said memory element fixed, with regard to one of said plurality of first test patterns;

a step of checking the operations of said synchronous sequential circuit by scanning in at least a part of said first test patterns to be set in said scan register and by supplying said second test patterns to said synchronous sequential circuit; and a step of repeating said scan-in and associated checks in a number of times equivalent to a number of said first test patterns, wherein:

said second test patterns are patterns added to a series of test patterns by applying a random pattern to an external input with the value set in said scan register being fixed and by examining a further detectable failure by a failure simulation.

8. The method for checking a synchronous sequential circuit, for use in detecting a degenerative failure in a synchronous sequential circuit having a memory element comprising a predetermined scan register and a combinational circuit means for receiving an external input and inputting a value from said memory element and for supplying an external output and outputting a value to said memory element, said method for checking the synchronous sequential circuit comprising:

a step of generating a plurality of first test patterns for use in a combinational circuit for an undetected first failure;

a step of generating at least one second test pattern for detecting a second failure by changing the value of an external input, with value set in the predetermined scan register in said memory element fixed, with regard to one of said plurality of first test patterns;

a step of checking the operations of said synchronous sequential circuit by scanning in at least a part of said first test patterns to be set in said scan register and by supplying said second test patterns to said synchronous sequential circuit; and a step of repeating said scan-in and associated checks in a number of times equivalent to a number of said first test patterns, wherein:

said second test pattern are patterns to be added to a series of test patterns by obtaining a value to be set in the external input of the synchronous sequential circuit by selecting an undetected failure and by generating a test pattern for use in a combinational circuit to detect said undetected failure.

* * * * *